United States Patent [19]

Ogawa

[11] 4,418,406
[45] Nov. 29, 1983

[54] SIGNAL WAVE CONTROL CIRCUIT

[75] Inventor: Hiroshi Ogawa, Tokyo, Japan

[73] Assignee: Sony Corporation, Tokyo, Japan

[21] Appl. No.: 304,167

[22] Filed: Sep. 21, 1981

[30] Foreign Application Priority Data

Sep. 24, 1980 [JP] Japan .............................. 55-132522

[51] Int. Cl.³ .............................................. G11B 5/09
[52] U.S. Cl. .................................. 369/124; 307/359; 360/39
[58] Field of Search ..................... 360/32, 33.1, 39, 41; 358/160, 166, 170, 171; 369/107, 109, 124, 128, 134; 307/494, 234, 351, 353, 354, 359, 265

[56] References Cited

U.S. PATENT DOCUMENTS

| | | | |
|---|---|---|---|
| 4,006,295 | 2/1977 | Operandi | 369/124 |
| 4,097,860 | 6/1978 | Ariseki | 307/359 X |
| 4,263,555 | 4/1981 | Hunka | 307/359 X |
| 4,352,999 | 10/1982 | Galpin | 307/354 |

FOREIGN PATENT DOCUMENTS 756444 9/1956 United Kingdom .
1505059 3/1978 United Kingdom .

*Primary Examiner*—Robert L. Richardson
*Attorney, Agent, or Firm*—Lewis H. Eslinger

[57] ABSTRACT

A signal wave control circuit includes a comparator having an input terminal for receiving an input signal, another input terminal for receiving a reference level signal and an output terminal producing an output signal having positive and negative portions corresponding to the input signal, a detector for detecting the maximum or minimum transition interval included in the output signal and for producing a detected signal, a hold circuit for holding the detected signal, and a control circuit for producing the reference level signal, whereby the interval of the positive portion of the output signal and the interval of the negative portion of the output signal become equal to each other.

12 Claims, 13 Drawing Figures

FIG. 1 (PRIOR ART)
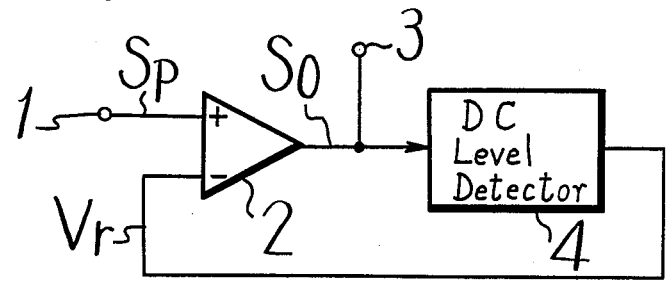
FIG. 2A (Sr) 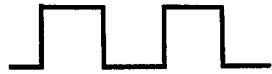
FIG. 2B (Sp) 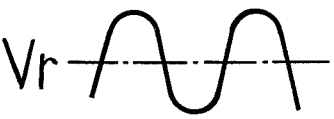
FIG. 2C (So) 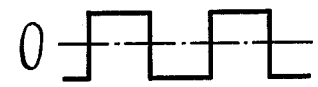

FIG. 3B (Sp) 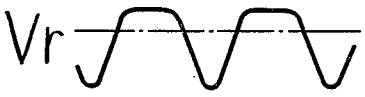
FIG. 3C (So) 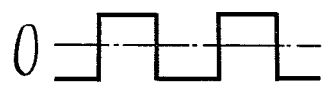

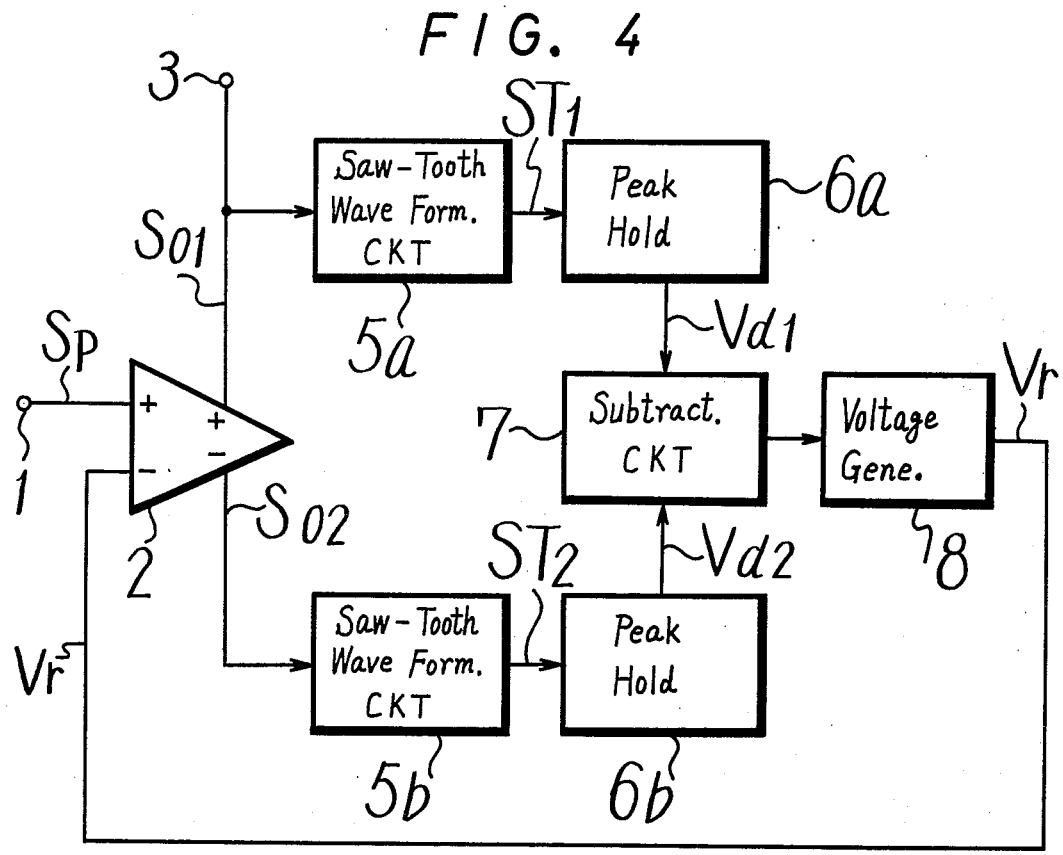
FIG. 4
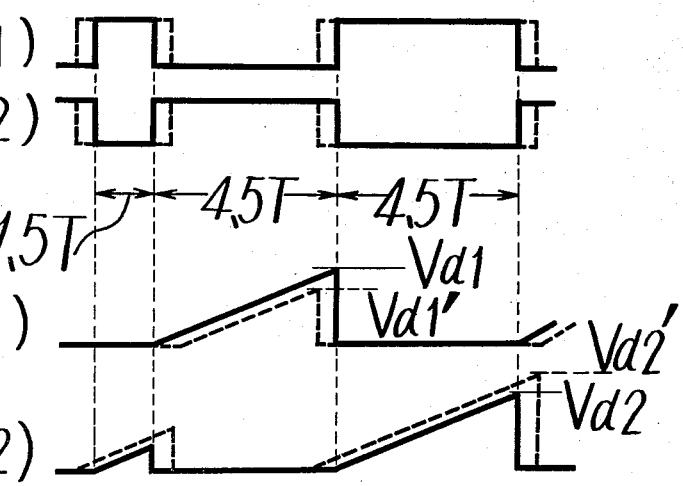
FIG. 5A (S01)
FIG. 5B (S02)
FIG. 5C (ST1)
FIG. 5D (ST2)

SIGNAL WAVE CONTROL CIRCUIT

BACKGROUND OF THE INVENTION

1. Field of the Invention

The present invention relates generally to a signal wave control circuit, and is directed more particularly to a signal wave control circuit suitable for use in a reproducing system for a digital audio disc record and so on.

2. Description of the Prior Art

At present, a digital-audio disc record has been developed in which in PCM (pulse code modulation) audio signal is recorded on a disc record, which is similar to a video disc, and then reproduced. As the reproducing system thereof, there are known signal detecting systems of a mechanical type, optical type, electrostatic capacity type or the like similar to those for the video disc record. In particular, in the optical of signal detecting system, upon recording a signal on a disc record, a laser which is light-modulated by a recording signal is employed to provide a mastering which is used to produce an original or master disc record formed with pits (or recesses) corresponding to the "1" or "0" bits of the recording signal. Then, a number of optical disc records are reproduced from the master disc record through a pressing process similar to that for an ordinary analog disc record. Depending on the condition of the mastering, there may occur a phenomenon (known as asymmetry) in which the size of the pits is shifted uniformly by a certain amount and hence even though the ON and OFF ratio of the recorded signal is 50%, the ON and OFF ratio of a reproduced signal does not become 50%. Thus, when the reproduced signal is converted to a pulse signal by a wave converting circuit, the pulse width of the pulse signal becomes different from that of the recorded signal, and as a result processes such as the demodulation of reproduced data (for example, the demodulation in the 3 PM system) and so on can not be carried out correctly.

In the art, the above problem is overcome by manually adjusting by an appropriate amount a reference level (or limit level) of a limiter to which the signal read out from the disc record is supplied and which serves as a signal wave converting circuit. Therefore, the prior art circuit requires a complicated adjusting operation.

Further, when a signal is recorded with the base band thereof without employing a carrier modulation system such as amplitude modulation, frequency modulation or the like, a run length limited code modulation system is used. Such a modulation system is used for the purpose that a minimum inversion interval T min between transitions of data between the "0" and "1" levels is selected to be long to increase the recording efficiency, while a maximum inversion interval T max is selected to be short, in order to improve the self clock function in the reproducing system. As an example, the 3 PM system is known in which T min is 1.5 T (where T is the length of a bit cell of input data) and T max is 6 T. Another purpose of shaping the reproduced signal is that when a digital signal is modulated, it is more desirable that the DC component of a modulated digital signal is zero.

FIG. 1 shows a prior art signal wave converting (or control) circuit. With this prior art circuit, a reproduced signal $S_p$ is supplied through an input terminal 1 to one input terminal of a limiter 2 whose output signal $S_0$ is delivered to an output terminal 3 and also fed to a DC level detecting circuit 4. This DC level detecting circuit 4 may be formed of a low pass filter, an integrating circuit or the like and the output therefrom is fed back to the other input terminal of the limiter 2 as a reference level $V_r$. This reference level $V_r$ has such a value to set at zero the DC component of the output signal $S_0$ from the limiter 2.

In operation, a recording signal $S_r$, which has an ON and OFF ratio of 50% as shown in FIG. 2A, is recorded. If there is no asymmetry, the reproduced signal $S_p$ becomes as shown in FIG. 2B. This reproduced signal $S_p$ does not have an ideal pulse wave shape, due to the influence of the frequency characteristics of transmission paths, the diameter of the read-out beam and so on. The reference level $V_r$ from the DC level detecting circuit 4 is such as will set at zero the DC level of the output signal $S_0$ from the limiter 2, which is shown in FIG. 2C. Thus, the output signal $S_0$ can be caused to have an ON and OFF ratio of 50%. However, even if the ON and OFF ratio of the recorded signal is 50%, if there occurs asymmetry, the recording becomes equivalent to one in which the signal is recorded with its pulse width being, for example, expanded as shown in FIG. 3A by the solid line. Thus, the reproduced signal $S_p$ applied to the input terminal 1 becomes as shown in FIG. 3B. Even in this case, since the reference level $V_r$ applied to the limiter 2 has the value to set at zero the DC component of the output signal $S_0$ from the limiter 2, the output signal $S_0$ becomes as shown in FIG. 3C which has an ON and OFF ratio of 50%.

As described above, according to the prior art signal wave converting circuit shown in FIG. 1, the problem caused by asymmetry can be automatically overcome. This example assumes however, that for the prior art signal wave converting circuit of FIG. 1 the level of the DC component of the recorded signal does not fluctuates in response to the data, which is required for correct operation. Even if the reference level is to be manually adjusted, the above condition is necessarily premised. With the prior art means, therefore, it is desired that the DC component of the modulated digital signal be held at zero.

To date there has been known almost no satisfactory modulation method in which the minimum inversion interval T min is long and the DC component (or low frequency component) is zero. For any such modulation method, the modulation circuit and demodulation circuit therefor must be complicated in construction.

OBJECTS AND SUMMARY OF THE INVENTION

Accordingly, it is an object of the present invention to provide a signal wave control circuit free from the defects inherent to the prior art.

It is another object of the invention to provide a signal wave control circuit which can automatically correct problems caused by the asymmetry in a disc record such as a digital audio disc record and so on.

It is a further object of the invention to provide a signal wave control circuit which can be applied not only to disc record reproduction but also to magnetic recording and reproduction in which run length limited code modulation method is employed.

It is a still further object of the invention to provide a signal wave control circuit with which, even when a modulated digital signal contains DC components, a reproduced signal the same as the recorded signal can be obtained.

In accord with the present invention, a control circuit for a signal wave having predetermined transition intervals includes comparator means having first and second input terminals receiving the signal wave and a reference signal, respectively, and generating a comparator output signal having positive and negative portions corresponding to the signal wave, detector means for detecting one of the predetermined transition intervals included in the comparator output signal and generating a detected signal in response thereto, holding means for storing the detected signal, and control means for receiving the detected signal from the holding means and supplying the reference signal to the comparator means so that the positive portions of the comparator output signal are equal in length to the negative portions of the output signal.

The above other objects, features and advantages of the present invention will become apparent from the following description taken in conjunction with the accompanying drawings in which like references designate like elements and parts.

BRIEF DESCRIPTION OF THE DRAWINGS

FIG. 1 is a block diagram showing a prior art signal wave control circuit;

FIGS. 2A, 2B, 2C and FIGS. 3A, 3B, 3C are wave form diagrams used to explain the operation of the circuit shown in FIG. 1;

FIG. 4 is a block diagram showing an example of the signal wave control circuit according to a present invention;

FIGS. 5A, 5B, 5C and 5D are wave form diagrams used to explain the operation of the circuit shown in FIG. 4.

DESCRIPTION OF THE PREFERRED EMBODIMENTS

Figure 3A:

An example of a signal wave control circuit according to the present invention will be described with reference to FIGS. 4 and 5.

In an example such as a modulation system using a run length limited code, a modulation system is used in which the minimum and maximum inversion intervals are limited to T min=1.5T and T max=4.5T. Now, this modulation system will be generally explained. When input data are changed from "0" to "1", the inversion takes place at the center of the bit cell of the input data. Also, in case of a pattern of successive "1" is data the successive "1" is sectioned at the boundary of the bit cell at every two or three bits and the inversion is generated at the boundary after the section. Further, in case of such a pattern of successive "0" data, the inversion is generated at a boundary which satisfies such a condition that it is separated by more than 3.5T from the former inversion and also by more than 1.5T from the center of the bit cell where a later "1" appears first.

This modulation system can make T max shorter (3.5T) as compared with that using a other system of the run length limited code, such as the 3 PM system. Further, it a bit pattern, of two successive inversion interval of 4.5T preceded by an inversion interval of 1.5T, as a frame synchronizing signal which pattern does not ordinarily occur.

According to this invention, the maximum or minimum inversion interval contained in the recorded signal is detected and held, and in the following example of the invention, the maximum inversion interval (=4.5T) is detected in an analog manner and then held.

Now, the above mentioned example of the invention will be described with reference to FIGS. 4 and 5. In the example of FIG. 4, a reproduced signal $S_p$ is applied from an input terminal 1 to a limiter 2 at a first input terminal which is supplied at a second input terminal with a reference voltage (limit level) $V_r$. The limiter 2 produces output signals $S_{01}$ and $S_{02}$ opposite in phase at positive and negative outputs, as shown in FIGS. 5A and 5B. In this case, the output signal $S_{01}$ is in phase with the reproduced signal $S_p$ applied to the input terminal 1 and is delivered to an output terminal 3. The output signals $S_{01}$ and $S_{02}$ are respectively supplied to saw-tooth wave forming circuits 5a and 5b, each having the same time constant. Saw-tooth waves $ST_1$ and $ST_2$ (shown in FIGS. 5C and 5D) derived from the saw-tooth wave forming circuits 5a and 5b are respectively fed to peak hold circuits 6a and 6b. Output voltages $Vd_1$ and $Vd_2$ from the peak hold circuits 6a and 6b, respectively, are applied to a subtracting circuit 7 and the output (which is an error signal) therefrom is fed to a voltage generating circuit 8 whose output is applied to or fed back to the limiter 2 as the reference voltage $V_r$ as set forth previously. The voltage generating circuit 8 in this example may be an amplifier.

The saw-tooth wave forming circuits 5a and 5b generate saw-tooth waves $ST_1$ and $ST_2$ whose levels gradually increase with the same inclination during the period in which the respective outputs $S_{01}$ and $S_{02}$ from the limiter 2 are zero ("0"). By way of example, a case will be explained in which the above-mentioned frame synchronizing signal is applied to the input terminal 1 as the reproduced signal $S_p$. At this time, from the limiter 2 the output signal $S_{01}$ shown in FIG. 5A and the output signal $S_{02}$ opposite in phase to the signal $S_{01}$ as shown in FIG. 5B, are derived. Then from the saw-tooth wave forming circuits 5a and 5b the saw-tooth waves $ST_1$ and $ST_2$ whose levels gradually increase at a predetermined inclination during the periods where the output signals $S_{01}$ and $S_{02}$ are respectively zero ("0"), as shown in FIGS. 5C and 5D, are obtained. When there is no asymmetry, if the reference level $V_r$ is taken as a predetermined level, the interval of 4.5T where the output signal $S_{01}$ from the limiter 2 is "0" is equal to the period of 4.5T where the output signal $S_{01}$ is "1" as indicated by the solid line in FIG. 5A. Similarly, in the output signal $S_{02}$ from the limiter 2 opposite in phase to the output signal $S_{01}$, the period 4.5T where the signal $S_{02}$ from the limiter 2 is "1" is equal to the period of 4.5T where the signal $S_{02}$ is "0" as indicated by the solid line in FIG. 5B. Accordingly, the peak value $Vd_1$ of the saw-tooth wave $ST_1$ becomes equal to the peak value $Vd_2$ of the saw-tooth wave $ST_2$ and hence the output or error signal from the subtracting circuit is zero. In this case, the reference voltage $V_r$ derived from the voltage generating circuit 8 is the predetermined level.

But, when there is asymmetry, the pulse width of the output signal $S_{01}$ from the limiter 2 where it is "1" becomes wider, while the period where the signal $S_{01}$ is "0" becomes narrower, as shown in FIG. 5A by the broken line, and the output signal $S_{02}$ opposite in phase to the signal $S_{01}$ is also changed, as shown in FIG. 5B by the broken line. Then, the peak value of the saw-tooth wave $ST_1$ becomes lower, as indicated at $Vd_1'$ by the broken line in FIG. 5C, while the peak value of the saw-tooth wave $ST_2$ increases, as indicated at $Vd_2'$ by the broken line in FIG. 5D. Thus, a negative error signal of $V_{d1}' - V_{d2}' = -\Delta V$ is generated by the subtracting circuit 7. The level of the reference voltage $V_r$ derived from the voltage generating circuit 8 is increased by the above error signal, and thus the circuit is so controlled that the error signal $\Delta V$ becomes zero ($\Delta V = 0$), whereby the fluctuation of the pulse width caused by the asymmetry can be removed. While, when the direction of the pulse width displacement caused by the asymmetry is opposite to that shown in FIGS. 5A and 5B, the polarity of the error signal becomes positive. In this case, the circuit is so controlled that the level of the reference voltage $V_r$ is lowered.

Further, in the case of a pattern in which an inversion interval exceeding the maximum inversion interval $T$ max (in the above case, 4.5T) of the modulation system is used as the frame synchronizing signal, to be distinguished from data, it is enough that the inversion interval of the synchronizing signal be detected and held. In short, the maximum or minimum inversion interval in the inversion interval contained in the reproduced signal is detected and held.

Figure 6:
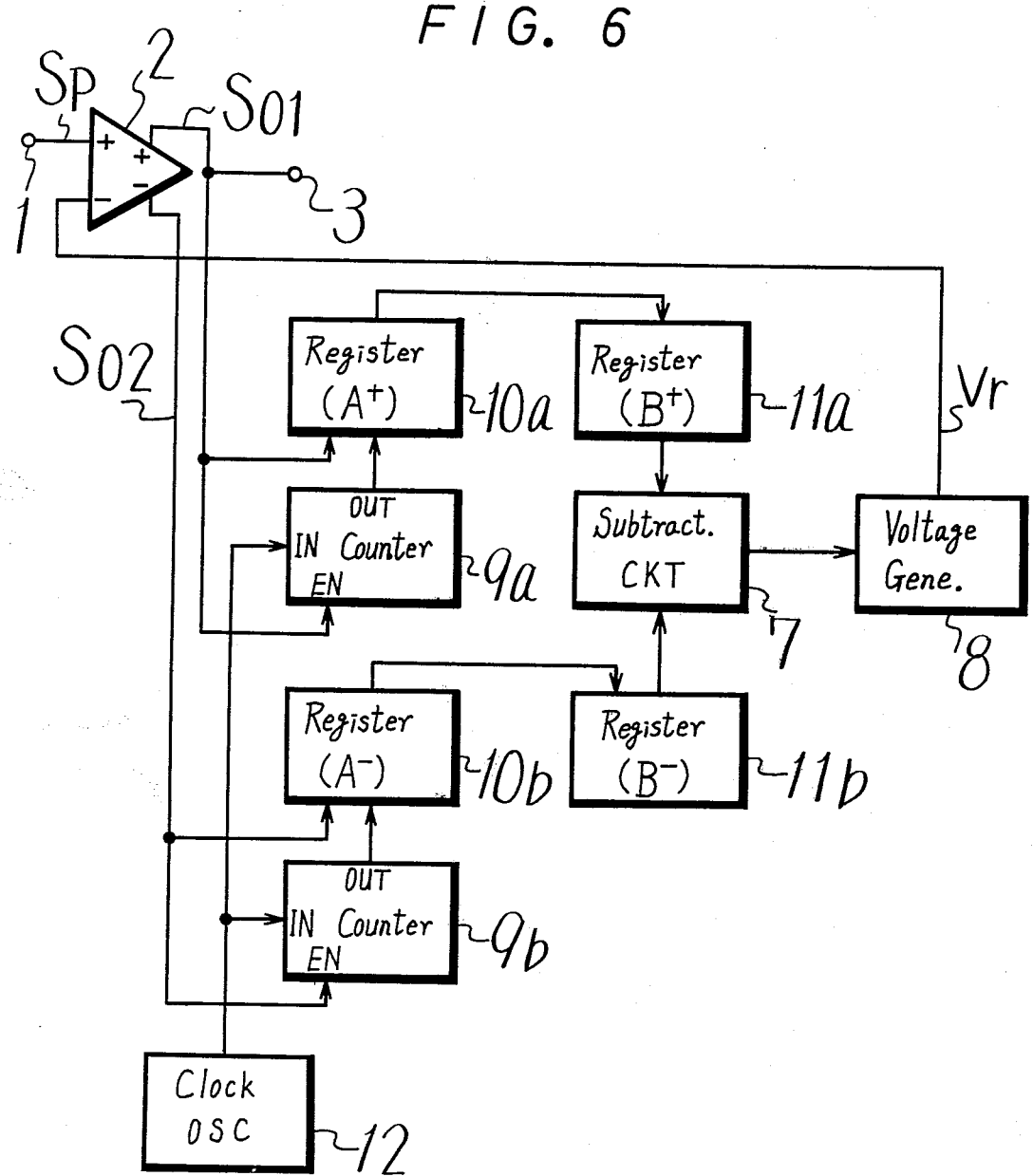
FIG. 6 is a block diagram showing another example of the invention.

FIG. 6 is a block diagram showing another example of the present invention. This example detects the maximum inversion interval by digital means and holds the detected interval in a different manner than the former example of the invention. In the example of the invention shown in FIG. 6, as in the first example of the invention, there is provided the limiter 2 which is supplied with the reference voltage $V_r$ from the voltage generating circuit 8 and the reproduced signal $S_p$ from the input terminal 1. The output signals $S_{01}$ and $S_{02}$ derived from the limiter 2, which are opposite in phase, are respctively supplied to enable terminals EN of counters 9a and 9b, which therefore are enabled to count clock pulses (of which the frequency is sufficiently higher than that of the data) from a clock oscillator 12 during the periods in which the signals $S_{01}$ and $S_{02}$ are "0". When the respective signals $S_{01}$ and $S_{02}$ change to "1" from "0", the outputs from the counters 9a and 9b are respectively supplied to registers 10a and 10b to be stored. The counters 9a and 9b are cleared during the period in which the signals $S_{01}$ and $S_{02}$ are "1". Registers 11a and 11b are respectively connected to the registers 10a and 10b and the contents of the registers 10a and 10b are respectively transferred to the registers 11a and 11b in accordance with the magnitude of values A+ and A− respectively stored in the registers 10a and 10b and also values B+ and B− stored in the registers 11a and 11b. More specifically, if the conditions A+ > B+ and A− > B− are both satisfied, the values A+ and A− are respectively transferred to the registers 11a and 11b, while if the conditions A+ ≦ B+ and A− ≦ B− are both satisfied, the contents of the registers 11a and 11b are both unchanged.

As described above, the data corresponding to the maximum values of the inversion intervals relating to the positive and negative polarities are stored in the respective registers 11a and 11b and the contents thereof are both supplied to the subtracting circuit 7. In a manner, similar to that in the first example of the invention, in the example of FIG. 6, an error signal is produced by the subtracting circuit 7, and the voltage generating circuit 8 produces a reference voltage $V_r$ which will then make the error signal zero.

In this example, the registers 11a and 11b are so arranged that their contents B+ and B− are reduced gradually at a certain unit time corresponding to the discharging time constant of the peak hold, for example, that of circuits 6a and 6b. Practically, the registers 11a and 11b each include a counter to which a subtracting input is applied. The unit time when the subtracting input is applied is determined in consideration of the period or interval when the maximum inversion interval (in the above example, the frame period) appears.

As will be understood from the above description of illustrative embodiments of the present invention, the problem caused by asymmetry in a digital audio disc record can be automatically removed.

Further, even when the level of the DC component fluctuates in accordance with the content of the recorded signal, by this invention the recorded signal can be reproduced with high fidelity; thus the signal wave control circuit of the present invention is high in reliability.

In addition, according to the invention, even when the rotation velocity of a disc record deviates from the reference value, the asymmetry can be automatically removed.

The above description has been given of preferred embodiments of the invention, but it will be apparent that many modifications and variations may be effected by one skilled in the art without departing from the spirit and scope of the novel concepts of the invention, so that the scope of the invention should be determined by the appended claims only.

I claim as my invention:

1. A control circuit for a signal wave having predetermined transition intervals, said circuit comprising:
   comparator means having first and second input terminals receiving said signal wave and a reference signal, respectively, and generating a comparator output signal having positive and negative portions corresponding to said signal wave;
   detector means for detecting one of said predetermined transition intervals included in said comparator output signal and generating a detected signal in response thereto;
   holding means for storing said detected signal; and
   control means for receiving said detected signal from said holding means and supplying said reference signal to said comparator means so that said positive portions of said comparator output signal are equal in length to said negative portions of said output signal.

2. The control circuit of claim 1; wherein said detector means detects a maximum transition interval included in said comparator output signal.

3. The control circuit of claim 1; wherein said detector means detects a minimum transition included in said comparator output signal.

4. The control circuit of claim 1; wherein said comparator means generates first and second output signals at first and second output terminals, respectively, representative of the difference between the voltages of said input signal and said reference signal, the voltages of said first and second output signals being further limited by upper and lower limit levels.

5. The control circuit of claim 4; wherein said detector means includes first and second detector circuits respectively supplied with said first and second output signals from said comparator means and generating respective first and second detector output signals.

6. The control circuit of claim 5; wherein said holding means includes first and second holding circuits respectively associated with said first and second detector circuits for storing said first and second detector output signals.

7. The control circuit of claim 6; wherein said control means includes subtracting means for calculating the difference between said first and second detector output signals stored in said first and second holding circuits.

8. The control circuit of claim 7; wherein said first and second detector circuits are saw-tooth wave forming circuits for supplying respective saw-tooth wave signals to said first and second holding circuits.

9. The control circuit of claim 8; wherein said first and second holding circuits are peak holding circuits for storing the respective maximum values of said first and second detector output signals.

10. The control circuit of claim 7; wherein said first and second detector circuits include respective first and second counter means for generating first and second time signals representative of the length of time the voltage level of said first and second output signals are substantially equal to upper and lower limit levels, and first and second register means for respectively storing said first and second time signals.

11. The control circuit of claim 10; and further comprising clock means for supplying clock pulses to said first and second counter means.

12. The control circuit of claim 10; wherein said first and second holding circuits include first and second register means for storing said first and second time signals.

* * * * *